United States Patent [19]

McGrath et al.

[11] Patent Number: 4,997,364

[45] Date of Patent: Mar. 5, 1991

[54] FURNACE ASSEMBLY FOR REFLOWING SOLDER ON PRINTED CIRCUIT BOARDS

[75] Inventors: Robert E. McGrath, Buena Park, Calif.; Thomas J. B. Girard, Ferndale, Mich.; John A. Buonawo, Mission Viejo; Joseph S. Romance, Diamond Bar, both of Calif.

[73] Assignee: Radiant Technology Corporation, Anaheim, Calif.

[21] Appl. No.: 241,762

[22] Filed: Sep. 7, 1988

Related U.S. Application Data

[63] Continuation-in-part of Ser. No. 161,354, Feb. 22, 1988, abandoned, which is a continuation-in-part of Ser. No. 18,109, Feb. 20, 1987, abandoned, which is a continuation-in-part of Ser. No. 851,558, Apr. 14, 1986, abandoned.

[51] Int. Cl.⁵ .............................................. F27B 9/28
[52] U.S. Cl. ...................................... 432/59; 432/122; 432/242
[58] Field of Search .................. 432/122, 123, 8, 59, 432/242, 115, 222; 34/242

[56] References Cited

U.S. PATENT DOCUMENTS

| | | |
|---|---|---|
| 15,273 | 1/1922 | Fuller . |
| 890,252 | 6/1908 | Thompson . |
| 1,537,027 | 5/1925 | Gleason et al. ............ 432/242 |
| 2,200,619 | 5/1940 | Fallon ....................... 432/242 |
| 2,977,106 | 3/1961 | Duff .......................... 432/242 |
| 3,063,878 | 11/1962 | Wilson ...................... 432/122 |
| 3,204,753 | 9/1965 | Moseley ................... 198/817 |
| 3,467,366 | 9/1969 | Westeren et al. ........ 432/242 |
| 3,606,288 | 9/1971 | Bloom ...................... 432/242 |
| 3,756,489 | 9/1973 | Chartet .................... 432/122 |
| 3,759,662 | 9/1973 | Bengel et al. ........... 432/242 |
| 3,778,221 | 12/1973 | Bloom ...................... 432/122 |
| 4,274,529 | 6/1981 | Mori et al. ............... 198/817 |
| 4,285,668 | 8/1981 | Pepe ......................... 432/242 |
| 4,403,953 | 9/1983 | Susuki ...................... 432/122 |
| 4,411,075 | 10/1983 | Blaudszun ............... 432/242 |
| 4,493,159 | 1/1985 | Schutz et al. ........... 432/242 |
| 4,517,448 | 5/1985 | Crain et al. ............. 219/388 |
| 4,631,812 | 12/1986 | Young ...................... 198/817 |
| 4,643,129 | 2/1987 | Sari .......................... 198/817 |
| 4,672,914 | 6/1987 | Sari .......................... 198/817 |

Primary Examiner—Henry C. Yuen
Attorney, Agent, or Firm—Christie, Parker & Hale

[57] ABSTRACT

A furnace assembly for automatically transporting circuit board of varying sizes through a firing chamber and for maintaining heat within the firing chamber and preventing ambient air from entering into the firing chamber by having an adjustable twin-track rail assembly for housing and positioning conveyor belts which secure the circuit boards and by having baffle gate chambers in which a series of baffle gates maintain a constant atmosphere at the open ends of the firing chamber.

39 Claims, 12 Drawing Sheets

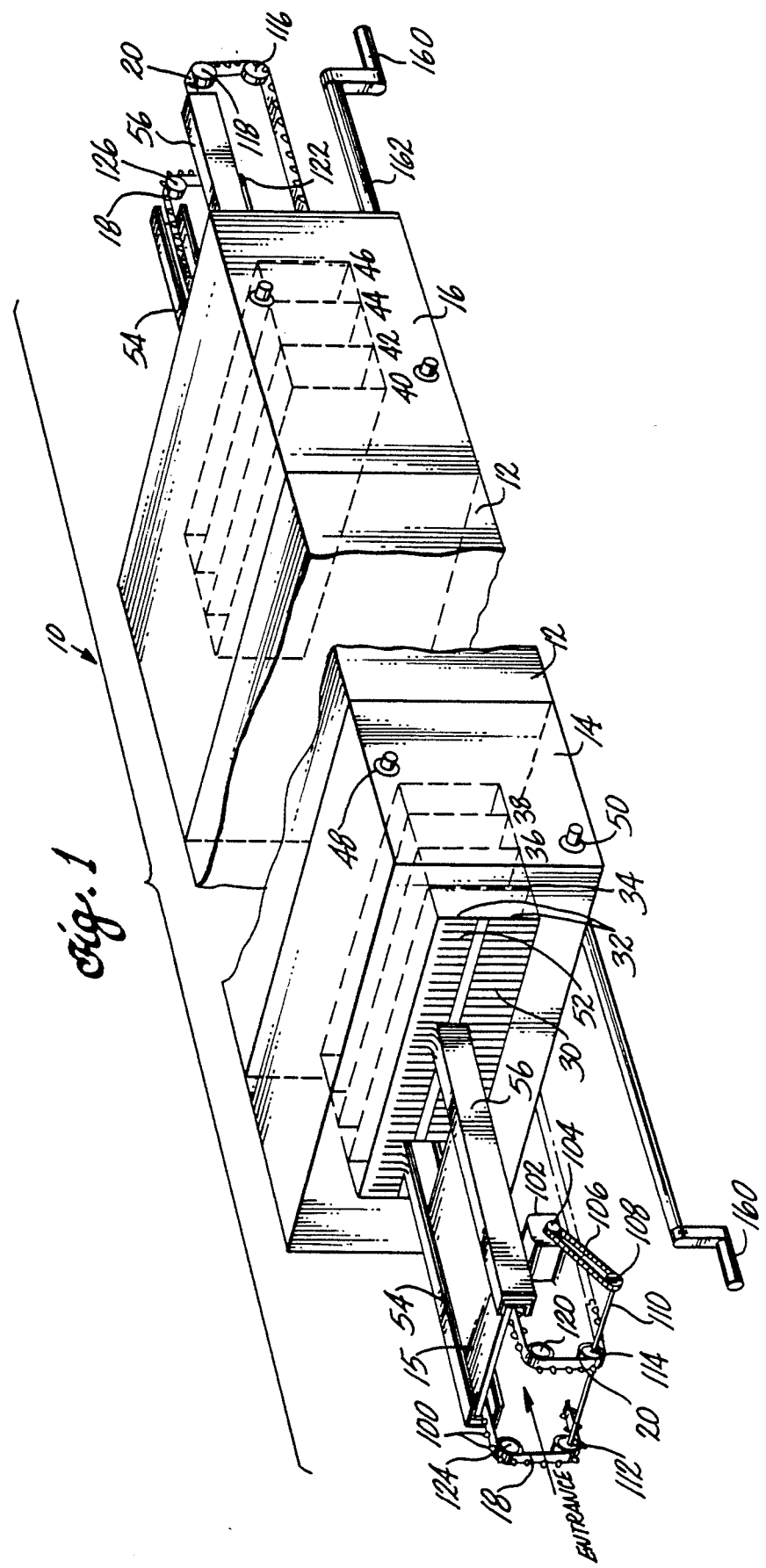

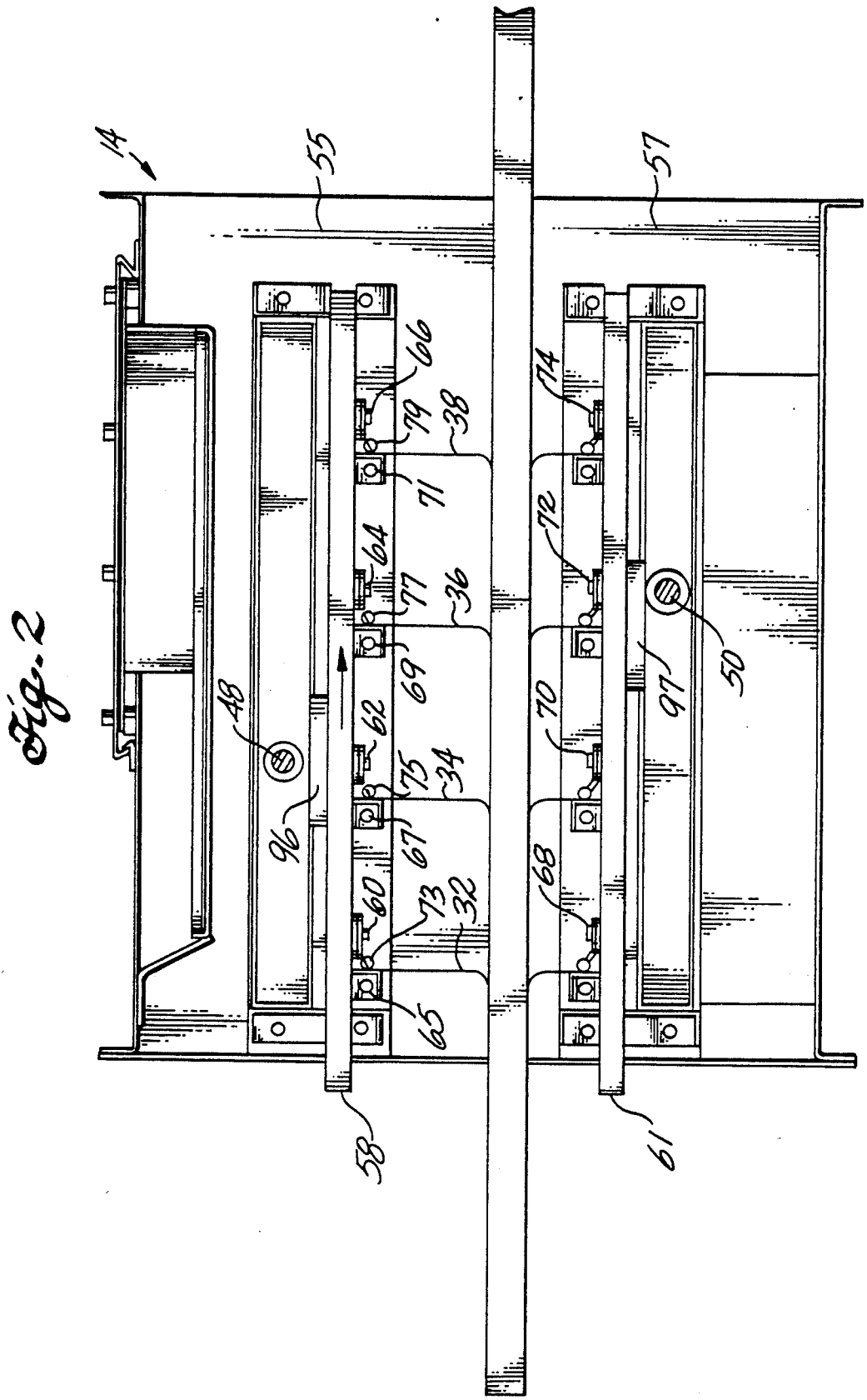

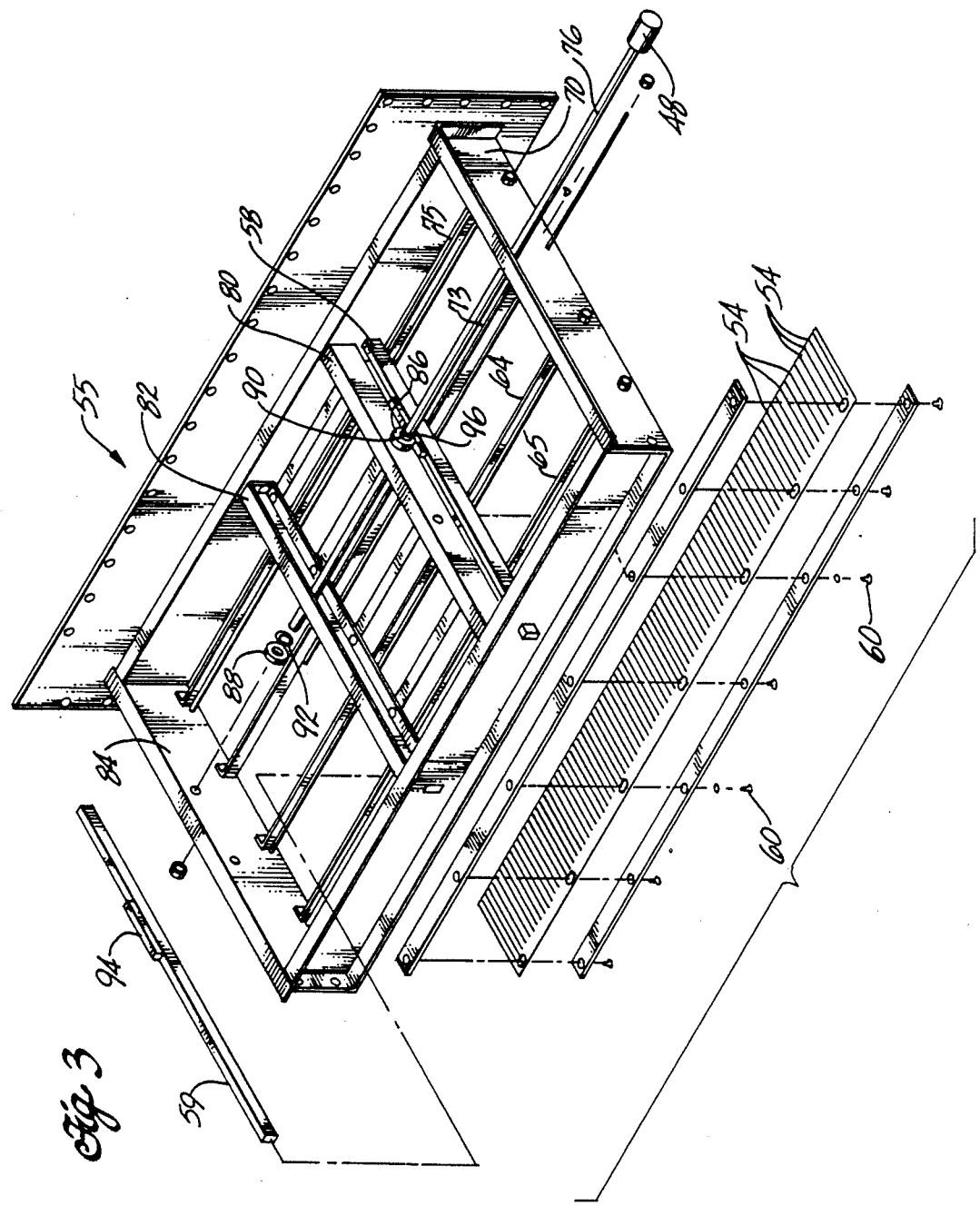

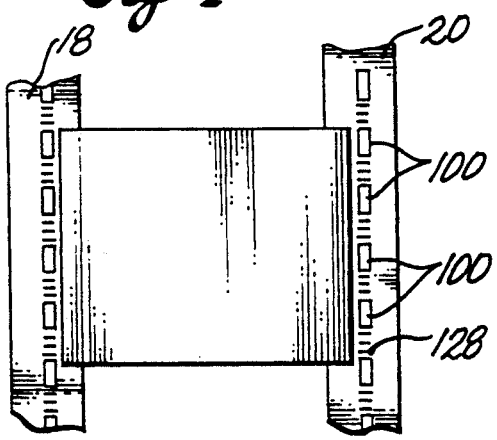
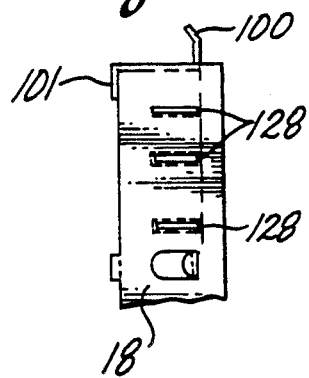
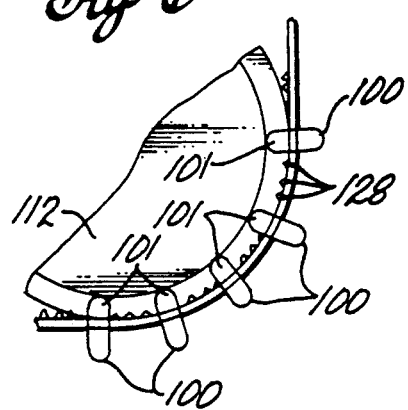
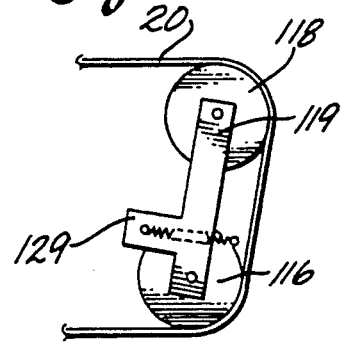
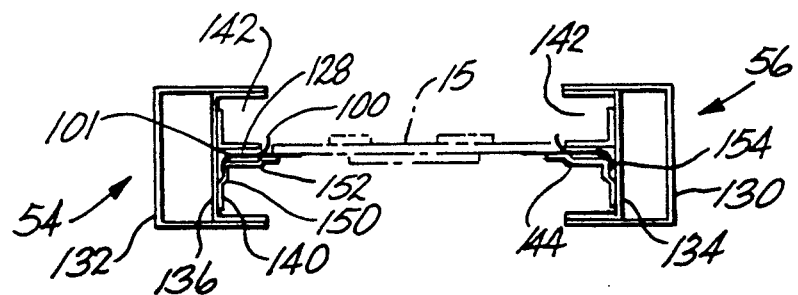

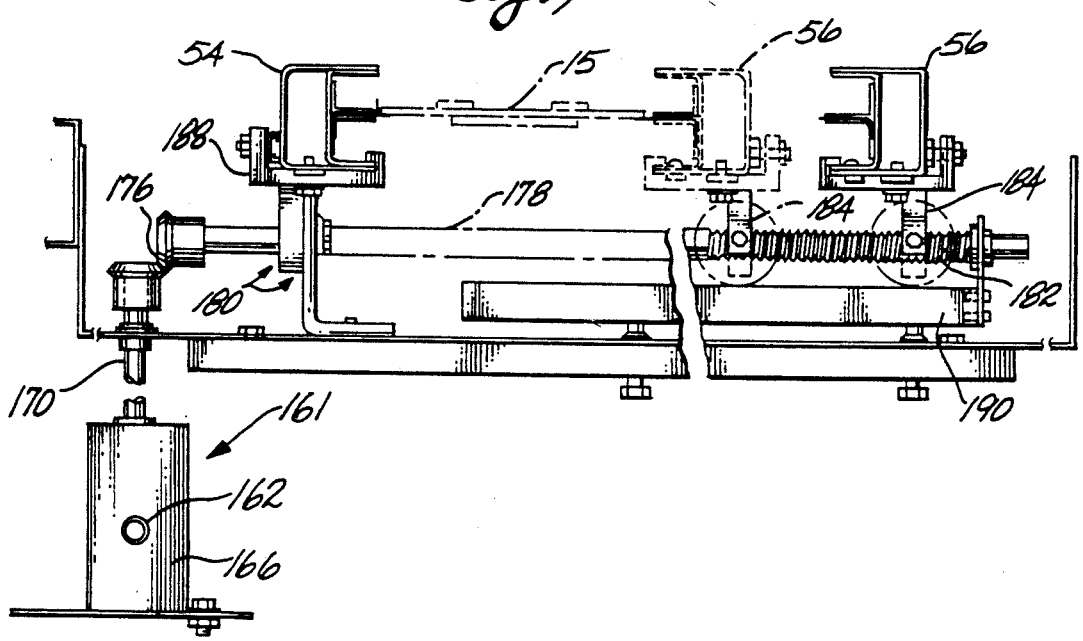
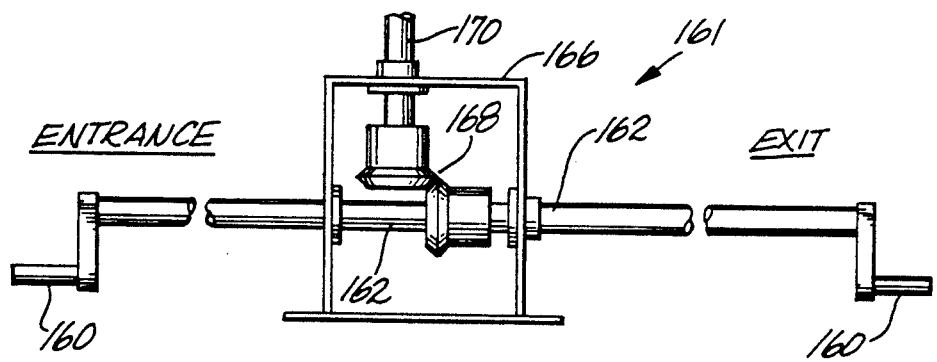

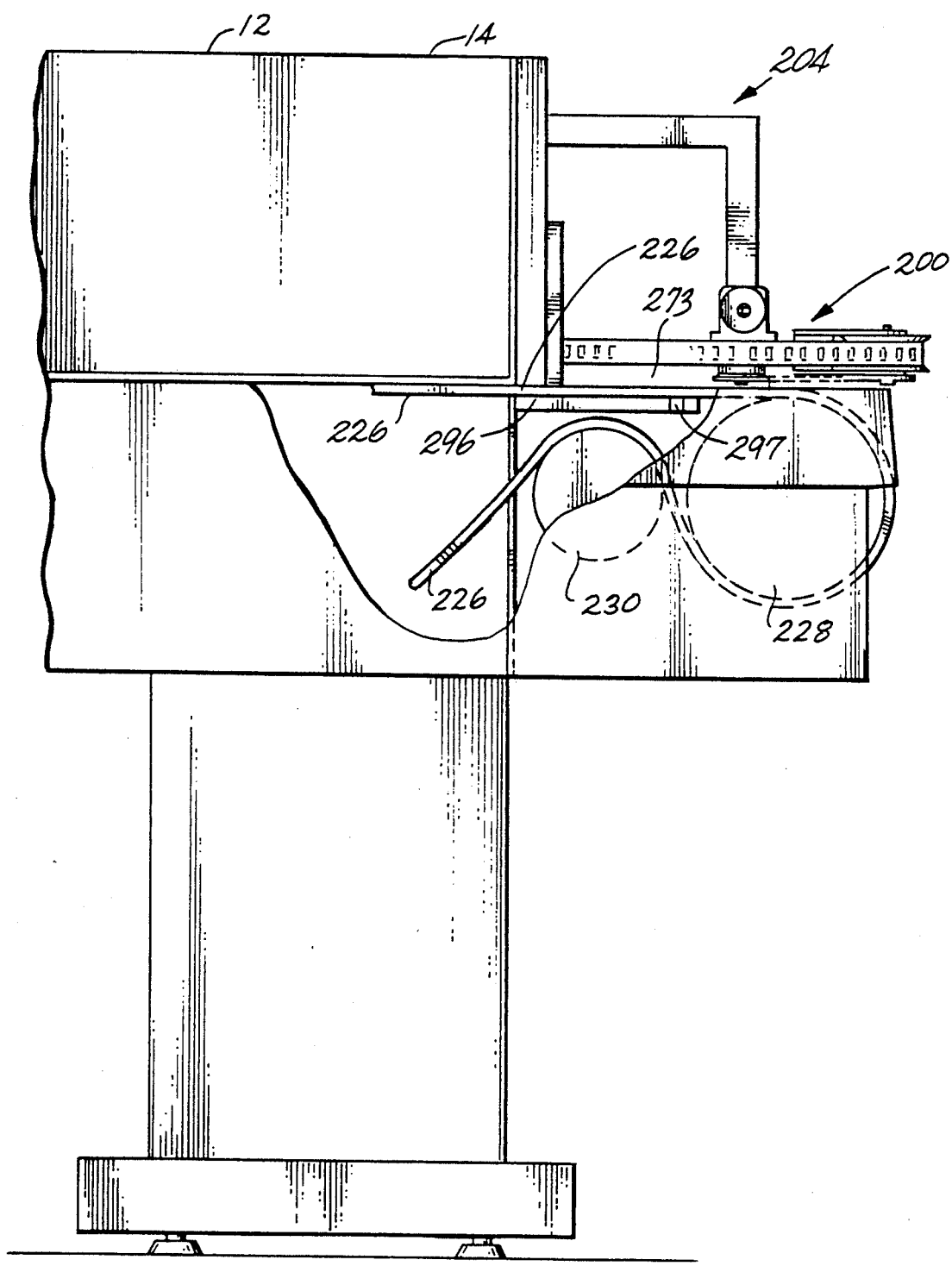

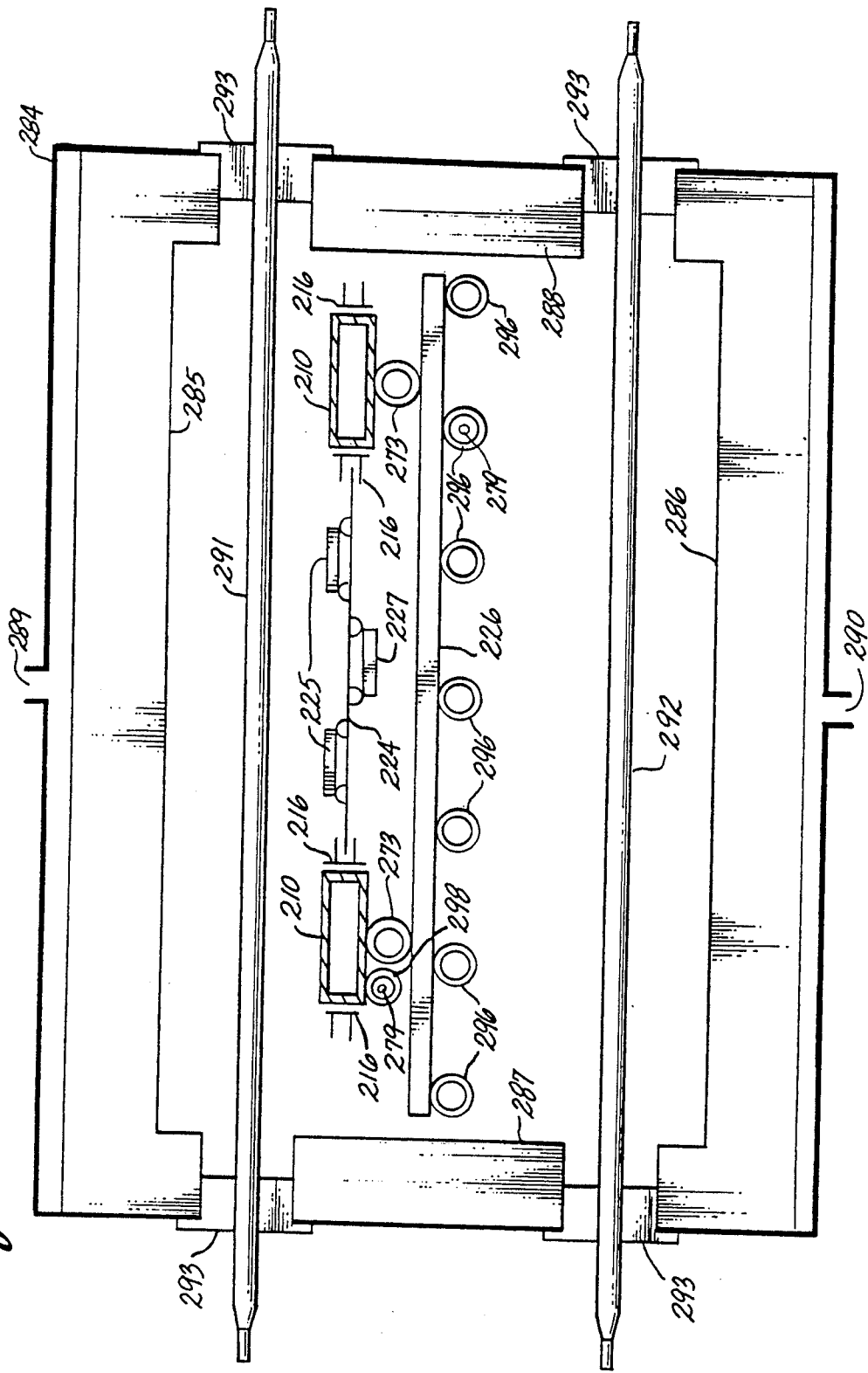

FURNACE ASSEMBLY FOR REFLOWING SOLDER ON PRINTED CIRCUIT BOARDS

REFERENCE TO RELATED APPLICATIONS

This application is a continuation-in-part of application Ser. No. 07/161,354, filed Feb. 22, 1988, now abandoned, which is a continuation-in-part of application Ser. No. 07/018,109, filed Feb. 20, 1987, now abandoned, which is a continuation-in-part of application Ser. No. 06/851/558 filed Apr. 14, 1986, now abandoned.

FIELD OF THE INVENTION

This invention relates to a furnace assembly for re-flowing solder on circuit boards for the connection of surface mounted electronic components to either side of the circuit boards, and more particularly, to an apparatus for maintaining a constant heat gradient at the open ends of a firing chamber and for automatically conveying various sized circuit boards through the length of the furnace assembly.

BACKGROUND OF THE INVENTION

Furnaces are known which introduce heat for the purpose of re-flowing solder for the connection of components to circuit boards. The existing furnaces, however, suffer from a number of disadvantages, including high operation costs due to heat loss and the passage of ambient air into the open ends of the furnace's firing chamber. Also, the heating profile within the firing chamber is often inconsistent due to currents of heat escaping from the open ends of the firing chamber. Another disadvantage with the prior furnaces is that they cannot easily accommodate and transport different sized circuit boards having electronic components on both sides of the circuit boards.

SUMMARY OF THE INVENTION

The aforesaid difficulties are overcome by the present invention which includes an adjustable twin-track conveyor for transporting circuit boards with surface mounted electronic components on either side of the boards, and baffle gate chambers for substantially preventing ambient air from flowing into and heat from flowing out of the openings of the firing chamber.

The baffle gate chambers permit a carefully controlled atmosphere and a precise temperature profile to be established in firing chamber at the end of a tunnel. Each baffle gate chamber consists of a series of baffle gates. More specifically, each baffle consists of a plurality of deflectable strips adaptable to conform to the twin-track conveyor, except for a slot between the twin-tracks for allowing the circuit boards with surface mounted components to pass unimpeded by the baffle.

In the preferred embodiment of the invention, the baffle gate chambers are air tight constructed of steel, with four or more rows of baffle gates. Additionally, the baffle gates are uniquely positioned by either a manual or automatic adjustors.

BRIEF DESCRIPTION OF THE DRAWINGS

FIG. 1 is a perspective view of a furnace assembly having adjustable baffle gate chambers at the open ends of the furnace tunnel, twin-track conveyors passing through the entire furnace assembly and embodying the present invention;

FIG. 2 is a side elevation cutaway view of a baffle gate chamber, illustrating extended baffle gates and control knobs for manually positioning the baffles;

FIG. 3 is an exploded perspective view of the assembly for manually adjusting the position of the upper or lower baffle;

FIG. 4 is a top plan view of the conveyor belts with a circuit board positioned therebetween;

FIG. 5 is a top view of one of the conveyor belts with upwardly and downwardly extending tabs and grippers;

FIG. 6 is a side view of one of the conveyor belts showing the upwardly and downwardly extending tabs and grippers positioned around a rubber friction roller;

FIG. 7 is a side view of two friction rollers and a mechanism for maintaining constant tension on the conveyor belt;

FIG. 8 is a front view of the twin-tracks with a circuit board inserted therebetween;

FIG. 9 is a front view of the twin-tracks showing a threaded shaft adjustment assembly;

FIG. 10 is a sectional view of a miter gear assembly for manually maneuvering the threaded shaft assembly;

FIG. 11 is a side view of another embodiment of a furnace assembly incorporating principals of the invention;

FIG. 18 is a cross-sectional view of the interior of the furnace of FIG. 11 illustrating schematically the arrangement for supporting the guide rails inside the furnace;

DETAILED DESCRIPTION

Figure 12:
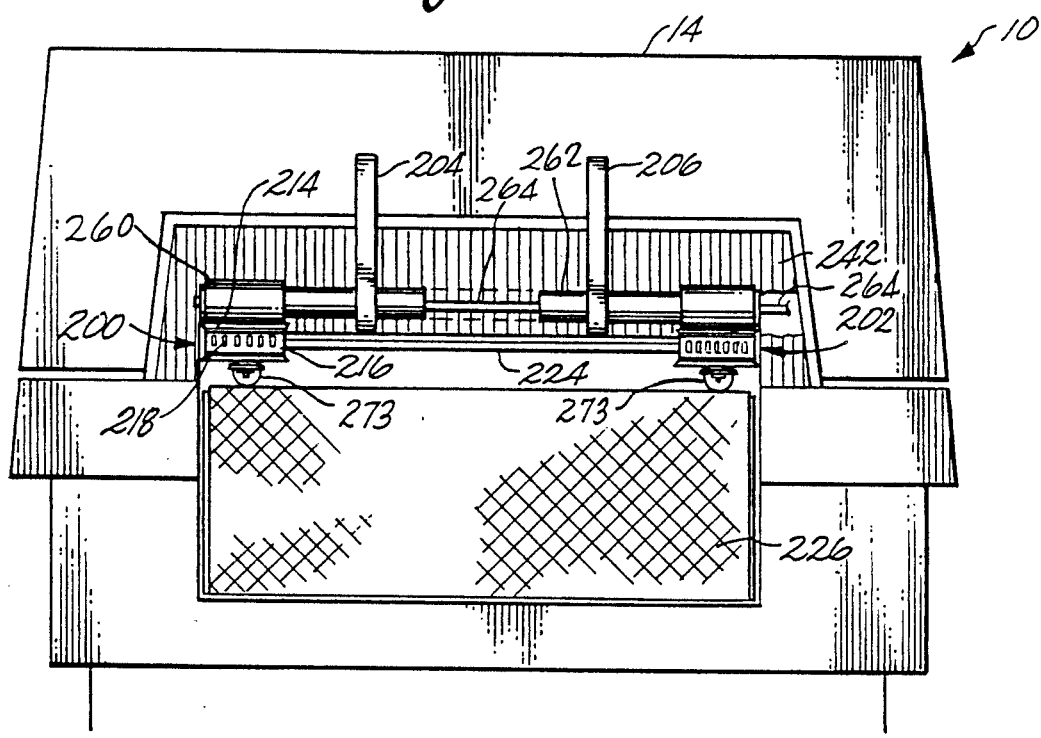
FIG. 12 is an end view of the furnace of FIG. 11 illustrating the entrance, the first baffle gate, the edge conveyors and the bridging conveyor.

Referring to FIG. 1, a baffle gate furnace assembly 10 is shown with a firing chamber 12, for re-flowing solder on a circuit board 15, and baffle gate chambers 14 and 16, for regulating the atmosphere of the firing chamber 12. The interior of the furnace assembly including firing chamber 12 and baffle gate chambers 14 and 16 is formed as a straight tunnel having open ends. In the preferred embodiment, the circuit board 15 has components on both sides. Conventional solder is heated and cooled on the topside of the circuit board 15 when the circuit board 15 is carried by conveyor belts 18, 20 through a tunnel passing through the baffle gate chamber 14, the firing chamber 12 and the baffle gate chamber 16. Baffle gate chamber 16 also includes a conventional cooling chamber.

In order to prevent ambient air from entering the firing chamber 12, and in order to maintain a constant gradient of heat before and/or after the firing chamber 12, identical baffle gate chambers 14 and 16, having four rows of baffle gates (32, 34, 36, 38, 40, 42, 44, 46), are positioned at the open ends of the firing chamber 12. The firing chamber 12 is essentially an infrared processing oven housed in a welded aluminum shell, lined with ceramic fiber insulation. In the preferred embodiment, the firing chamber is capable of operating with either oxidizing or inert atmospheres. An array of tungsten filament quartz lamps, on both the top and bottom portions of the firing chamber, generate radiant energy necessary to re-flow the solder on either side of the circuit boards. Typically, the firing chamber is 30" long, and it is partitioned into three different temperature zones. The zone lengths, the quartz lamp spacing, the voltages applied to the lamps, and the number of lamps all determine the heating profile within the firing chamber. The firing chamber is well known and a number of different configurations for firing chambers are equally applicable to the present invention. The following U.S. Pat. Nos. 4,517,448, 4,477,758, 4,460,821, and 4,460,444, disclose firing chambers suitable for the present invention and these patents are incorporated herein by reference.

FIG. 2 shows a detailed view of a baffle gate chamber 14. As shown, the four baffle gates 32, 34, 36, and 38 are in extended positions creating four separate sections within the chamber 14. The chamber can have any number of baffle gates depending upon the necessity of controlling heat loss and ambient air flow. Each chamber is air tight constructed of stainless steel, and each baffle gate consists of an upper and lower baffle which are independently adjustable by knobs 48 and 50 respectively. Each baffle is made of a series of strips 52 which are preferably made of a thin metal alloy which is sufficiently rigid so that the strips can support their own weight and so that they can easily deflect and flexibly conform around the twin-tracks 54 and 56. (See FIG. 1.) When the upper and lower baffle strips 52 are adjustably extended to the twin-track conveyor, a slot forms through which the circuit boards, having components on either side, can pass. When the baffles are extended from either the top or bottom of the chamber, the four gates effectively prevent ambient air from entering the firing chamber 12 and heat from leaving the firing chamber 12. Additionally, a curtain of an inert gas can he introduced by air rakes (not shown) from above and below the baffle gates to help prevent ambient air from entering into the firing chamber 12.

Referring to FIG. 2, the upper four baffles of the baffle gates 32, 34, 36 and 38 are connected to movable rack assemblies 58 and 59 (which is not shown) by rivet screws 60, 62, 64, and 66. The rack assemblies 58 and 59 are located within an upper assembly 55 (FIG. 3). The lower four baffles of the baffle gates 32, 34, 36, and 38 are connected to movable rack assemblies 61 and 63 (which is not shown) by rivet screws 68, 70, 72, and 74. The rack assemblies 61 and 63 are located within a lower assembly 57. The movement of the upper baffles is controlled by the positioning of the rack assemblies 58 and 59. Control knobs 48 is used for the manual positioning of the rack assemblies 58 and 59 within the upper assembly 55. More particularly, control knob 48 is attached to a drive shaft 76 as shown in FIG. 3. The drive shaft 76, extends through stationary rail assemblies 78, 80, 82, and 84. The drive shaft 76 has two spur gears 86 and 88 which are attached to drive shaft 76 by set screws (not shown). One spur gear 86 is positioned adjacent to the rail assembly 80 and maintained in position by washer 90. The spur gear 88 is positioned on the drive shaft 76 adjacent to the rail assembly 82 and maintained in position by washer 92. The spur gears 86 and 88 ride against spur gear racks 94 and 96, which are attached to rack assemblies 58 and 59 respectively. Relative spacing of the extended baffles within the chamber 14 is controlled by brackets 65, 67, 69 and 71 and pivot poles 73, 75, 77 and 79, which extend through the stationary rail assemblies 76, 78, 80, 82 and 84, of assembly 55. The brackets and pivot poles are located beneath the rack assemblies 58 and 59, so that when the rack assemblies are moved, the baffles are forced through a slot formed between the brackets and the pivot poles. Referring to FIG. 2, when racks 58 and 59 are moved in the direction shown, baffle 32, for example, is forced up between bracket 65 and pivot pole 73. The baffle 32 is constructed of thin metal alloys so that it can bend and flexibly rotate around the pivot pole, to a horizontal position above the twin track rails 56 and 54 (not shown). When the rack assemblies 58 and 59 are moved in the opposite direction, the baffle fexibly moves back to the vertical, extended position as shown in the FIG. 2.

In operation, assuming that each of the baffle gates 32, 34, 36, and 38 are in the extended position (FIG. 2), when the control knob 48 is rotated in the counter clockwise direction, the drive shaft 76 is rotated in a counter clockwise direction, rotating the spur gears 86 and 88 in the counter clockwise direction (FIG. 3). Rotation of the spur gears 86 and 88 along the spur gear racks 94 and 96 provides the force to the rack assemblies 58 and 59 required to position the baffles. Movement of the rack assemblies 58 and 59 forces the upper baffles to retract between the brackets and pivot poles to a horizontal position above the twin-track conveyor.

Adjustment of the lower four baffles of the baffle gates 32, 34, 36, and 38 is the same as the upper four baffles, except an identical lower rack assembly 57 and control knob 50 are at the bottom side of the baffle chamber 14. Control knob 50 is rotated in the clockwise direction in order to retract the racks below the twin-track conveyor. When the baffles are properly adjusted above and below the twin-track conveyor, a slot is created large enough to fit printed circuit boards having components on either side of the circuit boards as shown in FIG. 1.

In another embodiment of the invention, each baffle gate 32, 34, 36 and 38 consists of only one baffle, namely an upper baffle. More particularly, each baffle gate has an adjustable upper baffle and a nonadjustable stainless steel curtain, which conforms to the area vertically below the conveyor belt. For example, assume that the upper baffles of the baffle gates 32, 34, 36 and 38 (FIG. 2) consist of adjustable metal alloy strips and that instead of having lower baffles, stationary curtains conform to the area below the conveyor belt. This configuration of the baffle gate chamber is preferred when the circuit boards only have surface mounted components on one side of the boards. Thus, the necessity of adjusting the curtain below the conveyor does not exist because the furnace chamber can only reflow solder for the connection of components on the top side of the boards.

Referring to FIGS. 1 and 4, circuit boards are positioned in between two metal alloy conveyor belts 18 and 20. These belts carry the circuit boards through the baffle chambers 14 and 16 and the firing chamber 12. The belts are stamped out with a one piece metal alloy sheet and the tabs 100, and 101, and grippers 128 are bent into position. Tabs 100 locate the circuit boards on the belts with minimum play, preferably between 0.04 to 0.06 inches, through the entire furnace assembly 10. As shown in FIG. 1, a motor 102 provides drive motion to the belts 18 and 20. More particularly, drive motion to the belts 18 and 20 is provided by a chain sprocket 104, linked to roller chain 106, connected to the chain sprocket 108, which in turn rotates drive shaft 110. Drive shaft 110 is connected to the rubber friction drive rollers 112 and 114, which provide motion to the belts 18 and 20. Both conveyor belts 18 and 20 are maintained by four friction rollers which allow the belts to move around curved edges. For example, for belt 20, friction rollers 114, 116, 118, and 120 maintain the belt in a flexed orientation and accommodate the belt at the curved edges. Belt 18 is similarly maintained by four, friction rollers 112, 122, 124 and 126. Preferably, rollers 114 and 112 are made of rubber and rollers 116, 118, 120, 122, 124, and 126 are made of aluminum.

In this embodiment, the conveyor belts are held to each friction roller by gripper teeth 128. In FIGS. 5 and 6, the gripper teeth 128 are shown three at a time between the tabs 100 on the conveyor belt. FIG. 6 shows the gripper teeth protruding slightly into a rubber friction drive roller 112. As shown in FIG. 7, a friction roller 118 is mounted on the rear portion of the frame (not shown) in order to maintain a steady axial position and roller 116 is mounted on pivot arm 119 so that it can be flexibly positioned by the spring mechanism 129. Mechanism 129 forces the gripper teeth on the conveyor belt 20 to tightly engage the friction rollers 118 and 116 (FIG. 7). By having the rubber friction roller 116 flexibly positioned on pivot arms 119, the configuration also ensures that excess tension is not placed on the belt, causing the belt to positively engage rubber friction drive roller 114. The same configuration is provided for belt 18 and friction rollers 126 and 122.

Referring to FIGS. 1 and 8, circuit board 15 is shown positioned between tabs 100 on the conveyor belts 18 and 20 which are housed within the twin-track rails 54 and 56. The conveyor belts 18 and 20 are maintained through the length of the furnace assembly 10 by twin-track rail assemblies 56 and 58. Each twin-track rail is constructed of two elongated "U" shaped tracks. For example, twin-track rail 54 has a large "U" shaped track 132 encasing a smaller "U" shaped track 136. Two "L" shaped brackets 140, and 142 extend the length of the track 136. The vertical portions of the "L" shaped brackets 140 and 142 are welded to the track 136. The lower "L" bracket 140 is in an inverted position and the upper "L" bracket 142 is in an upright position, maintaining the vertical orientation of the belt. The lower "L" shaped bracket 140 is shaped slightly different from the upper "L" shaped bracket because it has accommodating indentations for the conveyor belt's tabs 101 and gripper teeth 128. The tabs 101 fit into the vertical slot 150 and the gripper teeth 128 fit into horizontal indentation 152, both extending the entire length of the rail. The horizontal portion of the upper "L" shaped bracket maintains the conveyor belt's tabs 101 within the slot 150 which together guide and maintain the lateral orientation of the belt 18 through the length of the rail. The horizontal portion of the lower "L" shaped bracket acts as a ledge support for the belt, maintaining the printed circuit boards and the belt in a horizontal orientation throughout the length of the twin-tracks.

The lateral distance between the two twin-track rails 54 and 56 is adjusted by the adjustment assemblies shown in FIGS. 9 and 10. An operator manually adjusts the lateral distance between the tracks by turning hand crank 160 located at the entrance and/or exit ends of the furnace assembly. The operator will turn the hand crank 160 in the direction necessary to adjust the lateral distance between the tracks so that the circuit boards are located between the tabs 100 and carried by the horizontal planar portions of the conveyor belts 18 and 20. Although the present embodiment incorporates a manually driven hand crank, it is envisioned that mechanical means for automatically adjusting the lateral distance between the tracks can also be incorporated.

A section view of a miter gear assembly 161 is shown in FIG. 10. Hand cranks 160 are connected to an axially extending drive shaft 162 which is connected to the miter gear 168. The miter gear 168 is secured in a gear assembly housing 166. The purpose of the miter gear 168 is to convert the rotational motion of the axially extending drive shaft 162 into rotational motion of a vertically extending drive shaft 170. The vertical rotation of the drive shaft 170 is then converted into axial rotation of the threaded drive shaft 178 by the miter gear configuration 176. (FIG. 9) The drive shaft 178 axially rotates through stationary and movable track mountings 188 and 184. The stationary track mounting has a bearing member 180 to encase the drive shaft 178 for smooth rotation. The drive shaft 178 has threads 182 in order to control the positioning of track mounting 184. As the threads 182 on the drive shaft 178, rotate through the threaded sleeve 184, the threaded sleeve moves in translational motion, in a direction according to the rotation of the threaded drive shaft 178. Thus, depending upon the direction in which the hand crank 160 is rotated, the mounting 184 moves along the drive shaft towards or away from the stationary track mounting 188. The movable track mounting 184 is restrained from rotation and it is mounted with a wheel 186 for facilitating its movement. The wheel 186, preferrably constructed of aluminum, rotates on the rail support 190 as the drive shaft 178 rotates. Depending upon the size of the circuit board 15, the rails are adjusted so that the conveyor belts 18 and 20 guide the circuit board 15, as shown in FIG. 9.

Depending on the length of the furnace assembly 10 (FIG. 1), more than one adjustment assembly (FIGS. 9 and 10), maybe required to laterally maneuver the rails 56 and 58. For example, a furnace assembly may have three adjustment assemblies located beneath the furnace assembly. Adjustment assemblies might be located at the entrance, the central portion, and at the end of the furnace assembly. Hand cranks 160 are connected to each of the adjustment assemblies by drive shaft 162. FIG. 1 shows a furnace assembly having hand cranks 160 and drive shaft 162 connected to a single adjustment assembly (not shown) located at the central portion of the furnace assembly 10.

Now referring back to FIG. 1, the operation of the furnace assembly is rather straight forward. The firing chamber 12 is heated to its desired temperature so that solder re-flow can occur on the circuit board 15. The baffle gates 32, 34, 36, 38, 40, 42, 44, and 46 are completely retracted above and below the twin-track rails 54 and 56 to allow for their adjustment. The twin-track rails are adjusted so that a circuit board 15 can fit between tabs 100 of the conveyor belts 18 and 20. The baffle gates are adjusted so that the strips of each baffle contact to the twin-tracks 54 and 56, leaving a slot between the tracks large enough to clear the circuit board components on either side. The conveyor belts 18 and 20 are driven by the rotated friction drive rollers 114 and 112. The printed circuit board passes through the entrance baffle gate chamber 14 at the entrance side of the firing chamber 12, where the solder on the circuit board is reflowed on the top or the bottom of the circuit board 15. When the heating of the circuit board 15 is completed, the circuit board passes through the exit baffle chamber 16 at which point the circuit boards can then be cooled, so that the solder can quickly harden on the circuit board 15.

Reference is made to FIGS. 11 to 17 for an alternative embodiment of furnace assembly 10. As in the previously described embodiment, furnace assembly 10 has a firing chamber 12 in the form of an open ended tunnel, a baffle gate chamber 14 at the open entrance end of the tunnel, and a cooling chamber and a baffle gate chamber (not shown) at the open exit end of the tunnel. In this embodiment, however, instead of edge conveyor belts that move in vertical planes, furnace assembly 10 has edge conveyors 200 and 202 that move in a common horizontal plane and lie outside of furnace 10 only where they extend beyond the ends of furnace 10. In other words, edge conveyors 200 and 202 return from the exit to the entrance of furnace assembly 10 by passing through the tunnel. Bracket assemblies 204 and 206 represented schematically in FIGS. 11 and 12 serve to attach each end of edge conveyors 200 and 202 to the furnace housing outside furnace assembly 10.

Edge conveyors 200 and 202 each comprise a hollow stationary guiding rail 210 having rectangular cross-section, a hollow slidable roller mount 212 having a rectangular cross-section on the entrance end of the guiding rail, a rotatable rubber roller 214, a flexible endless metal conveyor belt 216, a fixed roller mount not shown on the exit end of the guiding rail and a rubber roller not shown rotatably supported by the fixed roller mount. Guiding rail 210 is made from a high temperature metal alloy. Belt 216 is wrapped around the rubber rollers and extends along the lateral side surfaces of rail 210. Mount 212 is spring-loaded by means not shown to urge roller 214 away from the entrance end of rail 210 and thereby to tension belt 216. Belt 216 is preferably formed from a thin, e.g. 12 mils, strip of high temperature metal alloy such as Inconol 716, which is stamped to form pairs of equally spaced tabs 218 in a one piece construction. A permanent hard high temperature lubricant coating such as DRY LUB-11 is formed on the surface of belt 216 and a molybdenum disulfide dry high temperature power lubricant is also preferably applied to the surface of belt 216. The surface of belt 216 lies in vertical planes and tabs 218 extend from the surface of belt 216 in horizontal planes. Belt orientation and movement are in a horizontal plane. Typically, the longitudinal spacing between tabs is three-quarters of an inch, and the tab length is 300 mils. Belt guides 220 are secured to the top surface of rail 210 at closely spaced intervals, e.g. six to eight inches, along its length and extend downwardly in spaced relationship from the side surfaces of rail 210 to form channels in which the top edge of belt 216 rides. Belt guides 222 are secured to the bottom surface of rail 210 at closely spaced intervals, e.g. six to eight inches, along its length and extend upwardly in spaced relationship from the side surfaces of rail 210 to form channels in which the bottom edge of belt 216 rides. Thus, the position of belt 216 is closely controlled by the spring-loading on roller 214, the lateral side surfaces of rail 210 and guides 220 and 222. In this way, belts 216 are kept in a horizontal plane, i.e. they cannot sag, and the spacing between them is kept constant. The spacing between tabs of a pair is designed so a circuit board, such as 224 (FIG. 12), of all standard thicknesses fits between them with relatively loose clearance, e.g. up to one-half inch. The purpose of the upper tab of each pair is merely to prevent the ends of the circuit board from bowing up unduly when the center sags due to the high furnace temperature. To facilitate feeding the circuit boards into edge conveyors 200 and 202 manually, if applicable, feed guides 213 are attached to roller mounts 212 to assist engagement of the circuit boards with belt 216 between tabs 218.

An endless bridging conveyor 226, which could be made of a high temperature metal alloy, has an open mesh construction, passes through the tunnel from end to end of furnace assembly 10 and underlies edge conveyors 200 and 202 to bridge the gap therebetween. The openings of conveyor 226 are sufficiently large to permit the passage of infrared waves if lamps are mounted thereunder as described in the references patents. Under the entrance end of furnace assembly 10, conveyor 226 is wrapped around a rotatable drive drum 228 and over a rotatable idler drum 230 (FIG. 11) and is draped under the furnace to the exit end where it is wrapped around and over similar drums.

The described edge conveyor arrangement permits a lower tunnel profile, i.e. height, in conjunction with the bridging conveyor, which in turn reduces the outflow of gas from the tunnel. A typical tunnel height at the entrance and exit ends, in the baffle and cooling chambers and at the zone boundaries of the firing chamber is two and one-quarter inches. In the firing chambers, the height may be greater between zone boundaries to accommodate IR lamps above and below bridging conveyor 226.

Figure 16:
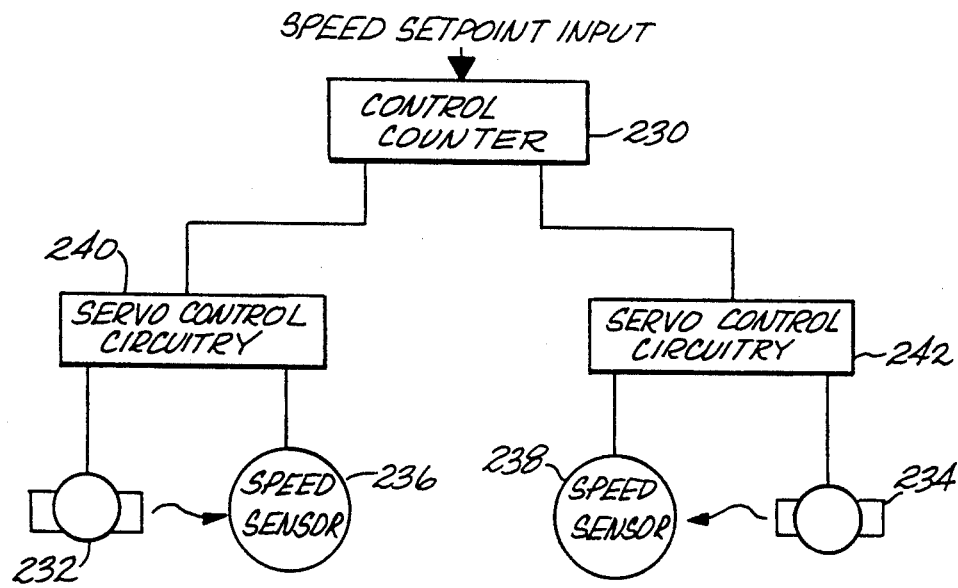
FIG. 16 is a schematic diagram of the speed control arrangement for the edge conveyors and the bridging conveyor of the furnace of FIG. 11.
Figure 17:
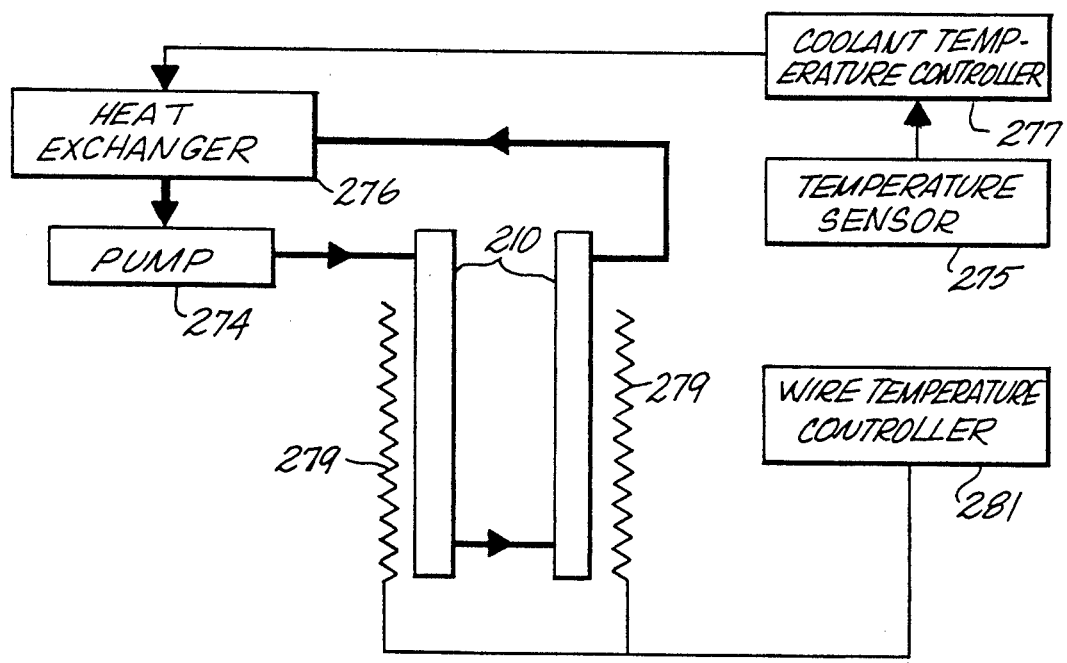
FIG. 17 is a sectional view of one of the edge conveyors of the furnace of FIG. 11 illustrating schematically the arrangement for controlling its temperature of the furnace of FIG. 11.

Preferably, edge conveyors 200 and 202 and bridging conveyor 226 are controlled to operate at the same linear speed. As a result, bridging conveyor 226 serves as "safety net" for circuit boards and surface mounted devices (SMD) placed thereon. If an SMD drops from its circuit board, it is carried through the furnace directly underneath the circuit board from which it dropped and can, therefore, be easily associated with the proper circuit board for manual installation after furnace processing. Furthermore, if one or both of the edges of a circuit board become disengaged from tabs 218, the circuit board will continue to be transported through the furnace in whole or in part by bridging conveyor 226 to complete processing without damage to the circuit board. The speed control arrangement for edge conveyors 200 and 202 and bridging conveyor 226 is depicted in FIG. 16 A single speed set point is input by a human operator to a control computer 220. An electric motor 232 drives edge conveyors 200 and 202 via the rubber rollers at the exit end of furnace assembly 10. An electric motor 234 drives bridging conveyor 226 via drum 228. Motor 232 is coupled to a speed sensor 236. Motor 234 is coupled to a speed sensor 238. The drive signal generated by computer 230 and the speed representative signal generated by sensor 236 are applied to servo control circuitry 240, which generates responsive thereto a motor drive signal for application to motor 232. The drive signal generated by computer 230 and the speed representative signal generated by sensor 238 are applied to servo control circuitry 242 which generates responsive thereto a motor drive signal for application to motor 234. As a result, motors 232 and 234 are both driven at the set point speed selected by the operator.

Figure 14:
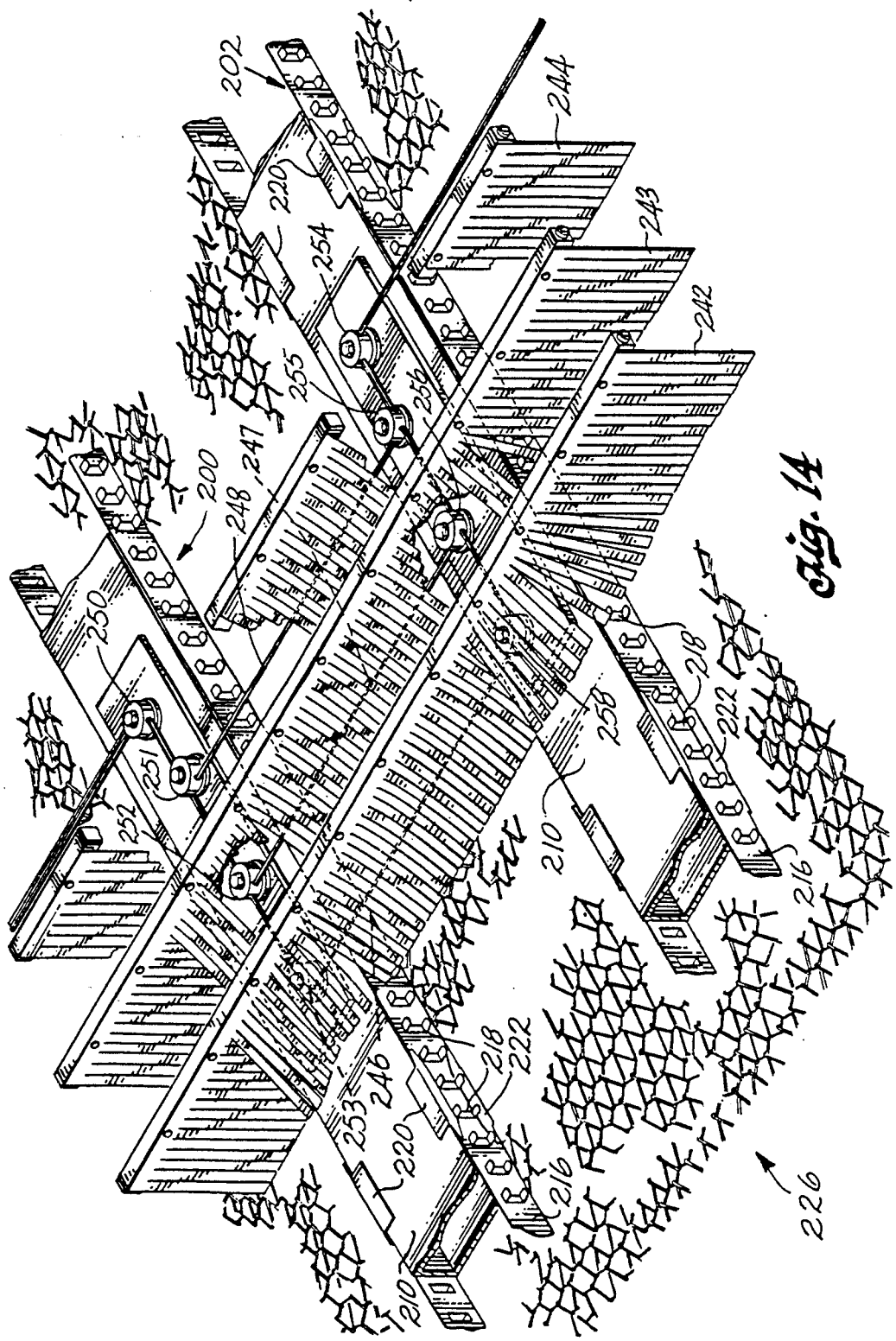
FIG. 14 is a perspective view of the baffle gates, the edge conveyors and the bridging conveyor of the furnace assembly of FIG. 11.
Figure 19B:
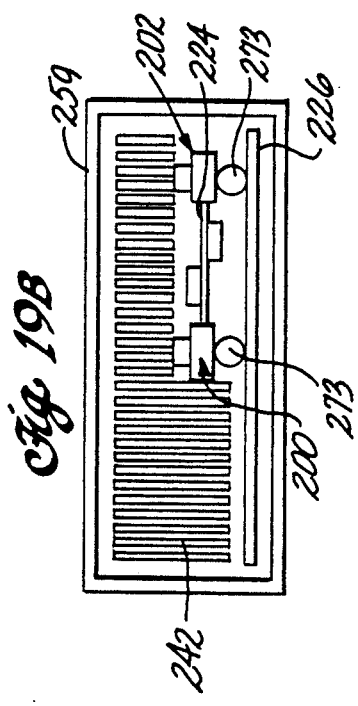
FIGS. 19A, 19B and 19C are end views of the furnace of FIG. 11 schematically illustrating different positions of one of the baffle gates.
Figure 19C:
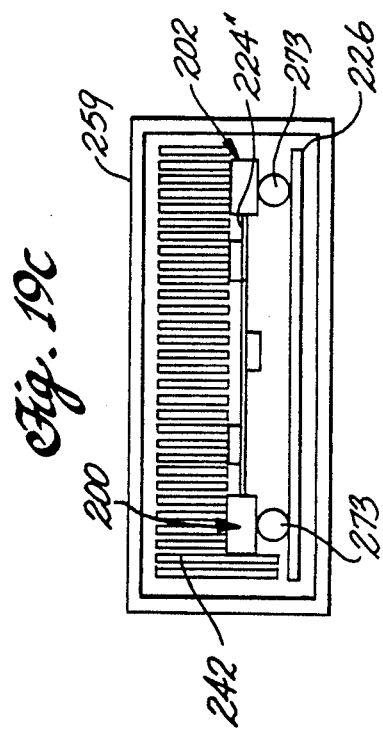
Figure 19A:
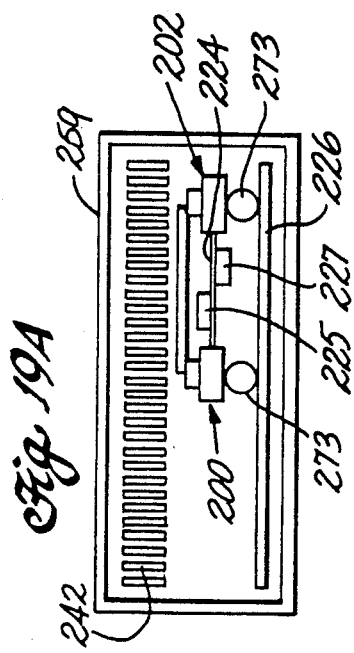

As illustrated in FIG. 14, this embodiment has baffle gates 242, 243 and 244, each of which comprise a single baffle attached to rack assemblies above the inside of the tunnel in the baffle chamber similar to rack assemblies 58 and 59 in FIG. 3. Rather than being adjustable as in the other embodiment, the baffles are designed to assume only two positions, open or closed. In the open position, the baffles give free access to the tunnel entrance. In the closed position, the baffles extend the full tunnel height almost to the top of bridging conveyor 226 in their undeflected condition, thereby completely closing the tunnel entrance. The baffles also extend the full width of the tunnel. As in the other embodiment, the strips of the baffle are deflected by edge conveyors 200 and 202 so as to closely conform thereto and close the space of the tunnel entrance outboard of the edge conveyors as the spacing between them changes. Unlike the other embodiment, the slot through which the circuit boards pass between the edge conveyors in entering the tunnel is created by taught stop wires 246, 247 and 248, which stretch between edge conveyors 200 and 202 under baffle gates 242, 243, 244, respectively. As a result, the strips of the baffles between edge conveyors 200 and 202 are deflected upwardly by the wires to form a slot for the circuit boards carried by edge conveyors 200 and 202 to enter the furnace tunnel. At one end, wires 246, 247 and 248 are fixed and at the other end, they are wrapped around spring loaded reels to keep them taught. Between their ends, wires 246, 247 and 248 are threaded through guide posts, 250, 251, 252 and 253 on the top surface of the rail of conveyor 200 and guide posts 254, 255, 256 and 258 on the top surface of the rail of edge conveyor 202. As the spacing between edge conveyors 200 and 202 is adjusted, the spring-loaded reels pay out or pull in wires 246, 247 and 248 and the number of the baffle strips deflected by wires 246, 247 and 248 changes. In FIGS. 19A, 19B, 19C, the entrance opening of the furnace is represented by reference numeral 259. In FIG. 19A, baffle gates 242, 253 and 244 are raised above the stop wires in the open position in upwardly spaced relationship from edge conveyors 200 and 202, while their spacing is adjusted to accommodate the width of circuit board 224. An SMD 225 is mounted on the top of circuit board 224 and an SMD 227 is mounted on the bottom of circuit board 224. As illustrated for a narrow circuit board 224' in FIG. 19B and a wide circuit board 224, in FIG. 19C, the portion of entrance opening 259 outboard of conveyor 200 is covered, i.e. blocked by the ends of the baffle gates, and the portion between edge conveyors 200 and 202 is clear for transport of the circuit boards.

Figure 15:
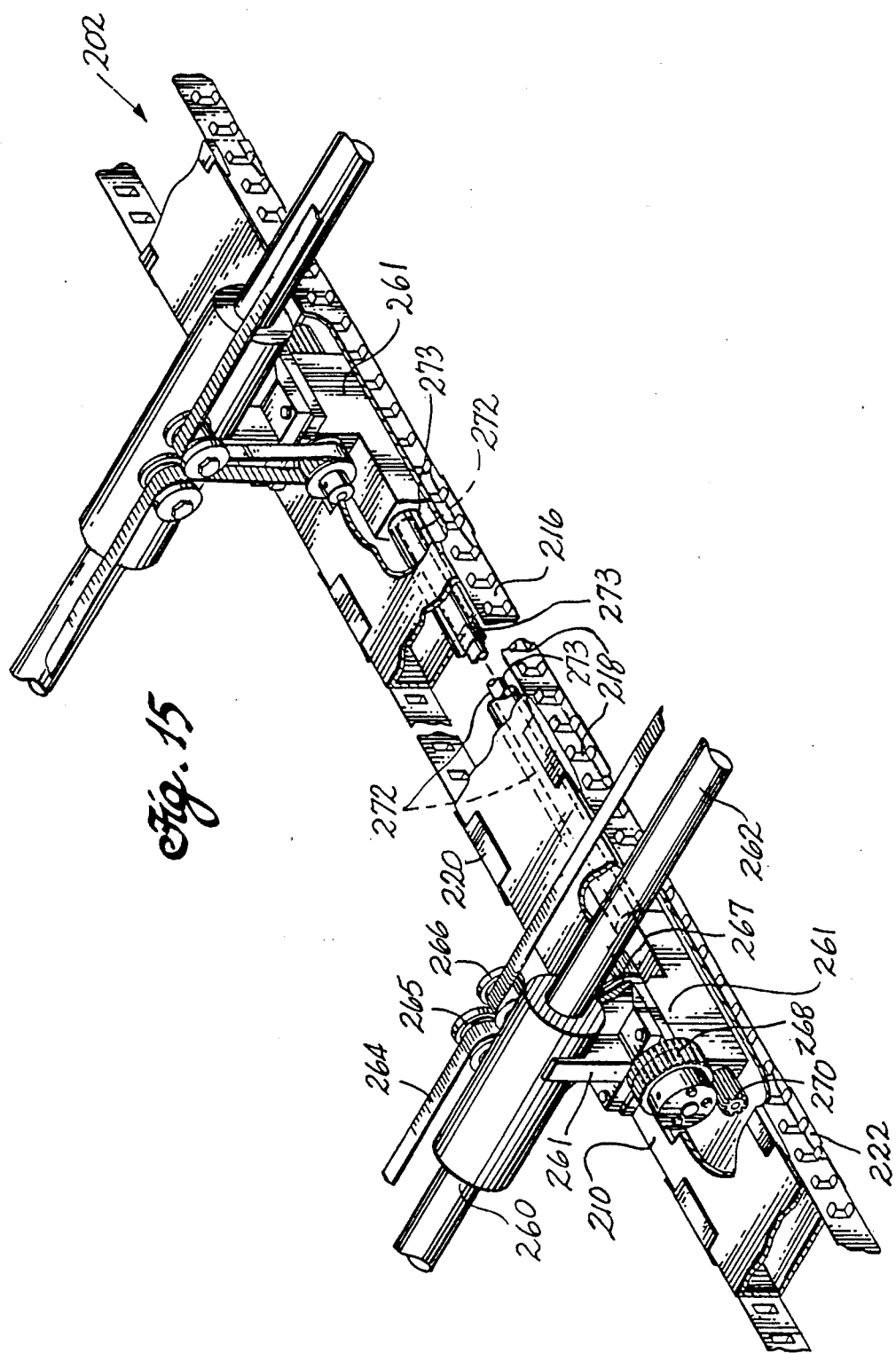
FIG. 15 is a prospective view of the adjustable edge conveyor of the furnace assembly of FIG. 11.

In this embodiment, the lateral position of edge conveyor 202 is adjustable to set the spacing between edge conveyors 200 and 202 to accommodate the width of the integrated circuit boards. As previously mentioned, edge conveyors 200 and 202 are each secured to the frame of furnace 10 by brackets 204 and 206 lying outside the furnace tunnel at the entrance and exit. FIG. 15 shows the adjustment mechanism for edge conveyor 202. At each end of edge conveyor 202 outside the furnace tunnel, a linear bearing 260 above the rail rides on a stationary transverse support rod 262, which is attached to brackets 204 and 206 by means not shown. Bearing 260 is secured to rail 210 by a bracket 261. The ends of a toothed rubber belt 264 running parallel to rod 262 are fixedly attached to the furnace housing by means not shown. Above the conveyor rail, belt 264 passes between rollers 265 and 266 attached to bearing 260 and around a roller 267 directly beneath rollers 265 and 266. Rollers 265, 266 and 267 have teeth that mesh with the teeth of belt 264. Roller 267 is connected to bracket 261. A spur gear 268 on the other side of bracket 261 is connected to roller 267 by a shaft not shown. Spur gear 268 extends vertically through the rail. A spur gear 270 engages spur gear 268 under the rail. A shaft 272 which passes through bracket 261 and extends through the furnace tunnel under the rail from entrance to exit, interconnects spur gears 270 at ends of edge conveyor 202. Shaft 272 is enclosed in a quartz tube 273 for protection from bridging conveyor 226. Tube 273 is attached at its ends to brackets 261. To adjust the lateral position of edge conveyor 202, an operator turns spur gear 268 with a tool. Belt 264 and rollers 265, 266 and 267 function as a rack and pinion to convert the rotation of gear 268 with a tool. Belt 264 and rollers 265, 266 and 267 function as a rack and pinion to convert the rotation of gear 268 to translation. Spur gear 270 transmits the rotation of spur gear 268 to the corresponding spur gear at the other end of edge conveyor 202, where such rotation is also converted to translation. As a result, the lateral movement of edge conveyor 202 is precisely coordinated at both ends by the described arrangement to within the accuracy of one tooth of belt 264 responsive to the tool adjustments made by the operator at one end.

Figure 13:
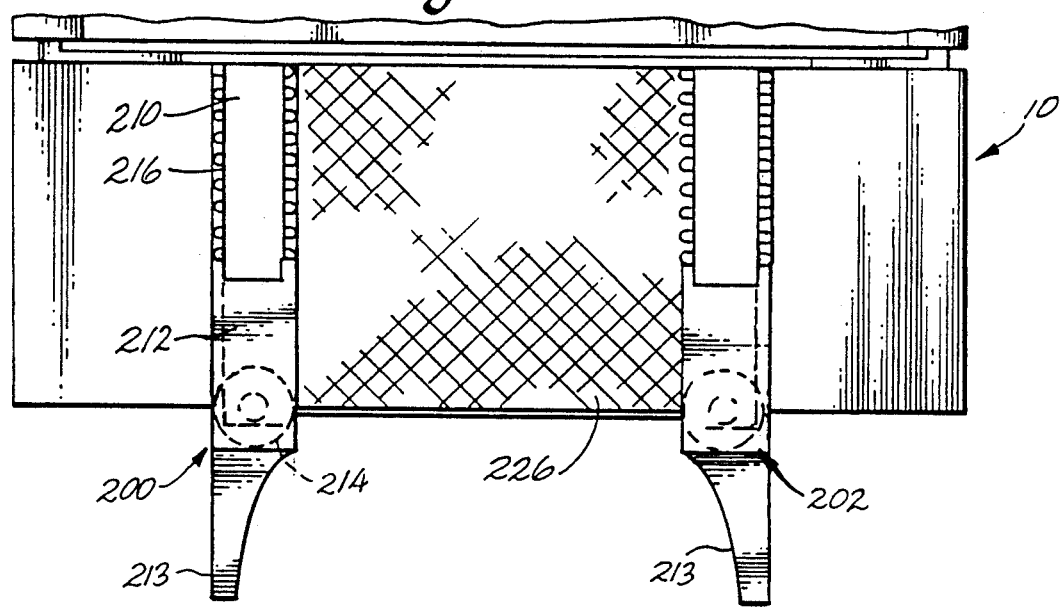
FIG. 13 is a top view of the end of the furnace of FIG. 11 illustrating the edge conveyors and the entrance end without the edge conveyor bracket assemblies and adjustment mechanism.

In operation, the spacing between edge conveyors 200 and 202 in first adjusted with the baffle gates raised to the open position as shown in FIG. 19A to fit the width of the circuit boards to be processed by furnace assembly 10, as described in connection with FIG. 15. Edge conveyor 202 is laterally adjusted so the circuit board fits between edge conveyors 200 and 202 to securely hold the circuit board between tabs 218 without creating appreciably more friction between conveyor belts 216 and rails 210, i.e. without binding conveyor belts 216. As conveyor belts 216 move through the furnace tunnel, the circuit boards to be processed are fed by a robot or a human operator between tabs 218 of the respective edge conveyors 200 and 202 at the point where conveyor belts 216 move around rollers 214 at the furnace entrance (FIG. 13). Similarly, at the furnace exit, the circuit boards are picked up by a robot or a human operator as they are released by edge conveyors 200 and 202.

In a solder reflowing process for connecting SMDs to a circuit board, it is important to keep close control over the temperature of the circuit boards. Generally, the circuit boards are heated up gradually to a point near the solder reflow temperature as they pass through the firing chamber and the boards then pass through a high temperature zone for a short period of time to quickly reflow the solder. In a typical furnace, there might be four different zones controlled to maintain different ambient temperatures. From entrance to exit the first zone might be maintained at 320° C., the second zone at 200° C., the third zone at 180° C., and the fourth zone at 300° C. According to a feature of the invention, the temperature of edge conveyors 200 and 202 is controlled to match the temperature of the circuit boards, particularly in the fourth zone where solder reflow takes place. Thus, the temperature across the full width of the circuit boards being processed during reflow remains constant despite the difference in conductivity of edge conveyors 200 and 202, which are made from a heat resistant metal alloy, and the circuit boards, which are principally made of a heat insulative material. In this sense, edge conveyors 200 and 202 appear "thermally invisible." As a result, solder reflow takes place uniformly across the width of the circuit boards without damage, i.e. blistering, charring, or discoloration, to the edge of the circuit boards. The hollow interior of rail 210 of each of edge conveyors 200 and 202 is closed off between the lateral rail adjustment mechanisms (FIG. 15) to form a leak free passage for coolant fluid, such as water or air. As represented schematically in FIG. 17, in the case of water, a pump 274 is connected to entrance end of the coolant passage through one rail 210 and a heat exchanger 276 is connected to the entrance end of the coolant passage through the other rail 210. Heat exchanger 276 is connected to pump 274 and the exit ends of the passages through rails 210 are connected together to form a closed loop cooling system. A temperature sensor 275 taps the coolant fluid as it flows out of the exit end of rail 210 toward heat exchanger 276. A temperature controller 277 regulates the flow rate of the coolant fluid through heat exchanger 276 and therefore the flow rate through the closed loop, responsive to temperature sensor 276 so as to maintain a constant predetermined coolant fluid temperature. Because of the high temperature at which the fourth zone is usually operated in relationship to the boiling point of water, the described cooling system is designed so the water in the system is below the desired temperature of rails 210 for the sake of safety. The temperature of rails 210 is raised by supplemental heaters 279 in proximity to rails 210 along their length. A wire temperature controller 281 has the capability of individually adjusting the electric current through each of heaters 279 so the temperature of edge conveyors 200 and 202 can be balanced. Sufficient electric current is applied to heaters 280 by controller 281 to raise the temperature of edge conveyors 200 and 202 enough to match the temperature of the circuit boards in the fourth zone of the furnace.

Metal supports inside the furnace are undesirable for various reasons. For example, they tend to cause cold spots within the furnace because they transmit heat to the exterior of the furnace and they expand greatly which makes it difficult to maintain parallelism between edge conveyors 200 and 202. Thus, the described conveyor systems are suspended within the furnace and supported by means outside the furnace tunnel, or at least outside firing chamber 12. In FIG. 18, is shown the outer metallic housing 284 of the firing chamber, a top panel of porous insulation 295 spaced downwardly from housing 284, a bottom panel of porous insulation 286 spaced upwardly from housing 284 and side panels of porous insulation 287 and 288. Housing 284 has gas inlet ports 289 and 290 through which pressurized gas is supplied to the furnace. This gas flows through the porous insulation into the firing chamber. A plurality of IR lamps 291 are mounted in the firing chamber transverse to the length of the tunnel above edge conveyors 200 and 202. A plurality of IR lamps 292 are mounted in the firing chamber transverse to the length of the tunnel below bridging conveyor 226. Lamps 291 and 292 pass through lamp holders 293 mounted in the side walls of the firing chamber so the terminals of lamps 291 and 292 lie outside the furnace. Lamp holders 293 could, for example, be constructed in the manner disclosed in U.S. Pat. No. 4,406,944 to Crain and Hardison the disclosure of which is incorporated herein fully by reference.

A plurality of parallel quartz tubes 296 extend through the tunnel of the furnace under bridging conveyor 226. Quartz tubes 296 are supported outside the furnace of at least outside the firing chamber by brackets connected to the frame such as bracket 297 (FIG. 11). Conveyor 226 bears on quartz tubes 296. Quartz tubes 274, which are attached to the bottoms of rails 210 by brackets (not shown) or other means and to two rail brackets 261 (FIG. 15) outside the furnace or at least outside the firing chamber, bear on the top surface of bridging conveyor 226. Therefore, the weight of edge conveyors 200 and 202 and the circuit boards they carry, is distributed among quartz tubes 296 so the vertical deflection, i.e. sagging, of rails 210 is reduced. In summary, the conveyor system is supported by a structure, i.e. the quartz tubes, that has a small thermal coefficient of expansion and that is attached to the frame of the furnace outside the firing chamber.

As mentioned in connection with FIG. 15, quartz tube 273 for edge conveyor 200 houses shaft 272. Heater 279 for edge conveyor 200 could be housed within another small quartz tube 298 attached to the underside of rail 210, as depicted in FIG. 18, by a bracket (not shown) or other means. Heater 279 of edge conveyor 202 could be housed in any of quartz tubes 296 in proximity of rail 210, as depicted in FIG. 18, since it is stationary.

The invention has been described in an exemplary and preferred embodiment, but it is not limited thereto. Those skilled in the art will recognize that a number of additional modifications and improvements can be made to the invention without departure from the essential spirit and scope. For example, the preferred embodiment of the invention may consist of only a firing chamber and a conveyor system for conveying the circuit boards there through. Additionally, it is envisioned that the preferred embodiment of the invention may consists of only one baffle gate chamber at only one opening of the firing chamber. Therefore, the invention is not limited by the above disclosure, but only by the following claims.

Although it is preferable to locate the infrared sources inside the tunnel so the circuit boards are directly exposed thereto as shown in FIG. 18, the invention can also be practiced in an infrared furnace in which the infrared sources are imbedded in or placed behind the insulative paneling.

What is claimed is:

1. A furnace assembly for processing circuit boards comprising:
    a housing that defines a tunnel having open ends;
    means for heating the interior of the tunnel;
    first and second edge conveyor means for receiving the edges of the circuit boards and carrying them through the tunnel from end to end, the first and second edge conveyor means being spaced apart to form a gap therebetween; and
    an endless conveyor underlying the first and second edge conveyor means to bridge the gap therebetween.

2. The furnace assembly of claim 1, additionally comprising means for driving the first and second edge conveyor means and the endless conveyor at the same linear speed.

3. The furnace assembly of claim 1, in which the heating means comprises a first infrared radiation source disposed above the endless conveyor and a second infrared radiation source disposed below the endless conveyer and the endless conveyer has an open mesh construction.

4. A furnace assembly comprising:
a housing that defines a tunnel having open ends;
means for heating the interior of the tunnel;
first and second means spaced apart for receiving and arraying circuit boards through the tunnel from end to end;
first and second means for guiding the first and second receiving and carrying means to maintain the spacing there between; and
means for controlling the temperature of the guiding means to match the temperature of circuit boards carried by the first and second receiving and carrying means.

5. The furnace assembly of claim 4, in which the receiving and carrying means comprise endless flat belts, each having a plurality of upwardly extending tabs for positioning circuit boards there between.

6. The furnace assembly of claim 4, in which the receiving and carrying means comprise endless flat belts, each having a plurality of downwardly extending tabs and the guiding means comprise rails, each having a slot in which the respective downwardly extending tabs ride.

7. The furnace assembly of claim 4, in which the receiving and carrying means comprise endless flat belts passing through the tunnel and the guiding means comprise rails passing through the tunnel and having slots in which the edges of the belts ride.

8. The furnace assembly of claim 4, in which the receiving and carrying means comprise endless flat belts, each having a plurality of upwardly extending tab and a plurality of downwardly extending tabs, the guiding means comprise rails, each having a slot in which the respective downwardly extending tabs ride.

9. The furnace assembly in claim 4, in which the receiving and carrying means comprise endless flat belts, passing through the tunnel, having a plurality of upwardly extending tabs and a plurality of downwardly extending tabs, the guiding means comprise rails, passing through the tunnel, having a slot in which the respective downwardly extending tabs ride.

10. The furnace assembly of claim 4, in which each guiding means has a first horizontally extending rail underlying the corresponding receiving means for support and a second horizontally extending rail overlying the corresponding receiving means for confinement thereof in conjunction with the first rail.

11. The furnace assembly of claim 8, wherein the baffles are perpendicularly mounted above and below the twin-track rails.

12. The furnace assembly of claim 8, wherein the first and second baffles are retractable from and descendible to the twin-track rails.

13. The furnace assembly of claim 4, in which the heating means comprises an infrared radiation source.

14. The furnace assembly of claim 13, in which the infrared radiation source is a plurality of elongated infrared lamps disposed inside the tunnel transverse to the length of the tunnel.

15. The furnace assembly of claim 4, additionally comprising means for laterally adjusting the first receiving means and the first guiding means to change the spacing between the first and second receiving means.

16. The furnace assembly of claim 15, in which the adjusting means comprises means outside each end of the tunnel for laterally moving the first guiding means and means for interconnecting the moving means to coordinate the lateral movement of the ends of the guiding means.

17. The furnace assembly of claim 16, in which the moving means each comprise a fixed flexible toothed belt and a rotatable spur gear that engages the belt and the interconnecting means comprises a rotatable shaft connected to the spur gears of the moving means.

18. The furnace assembly of claim 4, additionally comprising an endless conveyer underlying the first and second receiving means to bridge the gap therebetween.

19. The furnace assembly of claim 18, additionally comprising means for driving the first and second receiving means and the conveyer at the same linear speed.

20. The furnace assembly of claim 18, additionally comprising first and second supports on which the respective first and second guiding means bear, the first and second supports bearing on the conveyer, and a third support on which the conveyer bears.

21. The furnace assembly of claim 20, in which each support comprises one or more quartz rods the ends of which are attached to the housing outside the tunnel.

22. The furnace assembly of claim 4, in which the receiving means each comprise a flexible endless belt oriented to move in a horizontal plane.

23. The furnace assembly of claim 22, in which the guiding means each comprise a rectangular rail having a lateral side surface facing the lateral side surface of the other rail and belt guide means adjacent to the lateral side surface forming therewith channels in which the corresponding belt rides.

24. The furnace assembly of claim 23, in which the guiding means each additionally comprise means for tensioning the belt.

25. The furnace assembly of claim 24, in which the belts each have a plurality of pairs of horizontal tabs adapted to receive the edges of circuit boards.

26. A furnace assembly for processing circuit boards comprising:
a housing that defines a tunnel having open ends;
means for heating the interior of the tunnel;
first and second spaced apart means for receiving the edges of the circuit boards and carrying them through the tunnel from end to end;
means for controlling the temperature of the receiving and carrying means to match the temperature of the circuit boards; and
means for laterally adjusting the first receiving means to change the spacing between the first and second receiving means.

27. The furnace assembly of claim 26, in which the adjusting means comprises means outside each end of the tunnel for laterally moving the first receiving means and means for interconnecting the moving means to coordinate the lateral movement of the ends of the receiving means.

28. The furnace assembly of claim 27, in which the moving means each comprise a fixed flexible toothed belt and a rotatable spur gear that engages the belt and the interconnecting means comprise a rotatable shaft connected to the spur gears of the moving means.

29. A furnace assembly for processing circuit boards comprising:
- a housing that defines a tunnel having open ends;
- means for heating the interior of the tunnel;
- first and second spaced apart means for receiving the edges of the circuit boards and carrying them through the tunnel from end to end;
- a plurality of downwardly extending, individually deflectable adjacent strips across one of the open ends; and
- means for upwardly deflecting the strips between the first and second receiving means to form a slot for the passage of circuit boards therebetween while the remaining strips are undeflected and cover the open end.

30. The furnace assembly of claim 29, in which the deflecting means comprise a wire extending between the first and second receiving means under the strips between the first and second receiving means.

31. The furnace assembly of claim 30, in which one end of the wire is fixed, the furnace assembly additionally comprising means for laterally adjusting the first receiving means to change the spacing between the first and second receiving means and a spring loaded reel around which one end of the wire is wound to kept the wire taught as the spacing between the first and second reels changes.

32. The furnace assembly of claim 29, additionally comprising a plurality of downwardly extending, individually deflectable adjacent strips across the other open end and means for upwardly deflecting the strips between the first and second receiving means to form a slot for the passage of circuit boards therebetween while the remaining strips are undeflected and cover the open end.

33. A furnace assembly for processing circuit boards comprising:
- a housing that defines a tunnel having open ends;
- means for heating the interior of the tunnel;
- first and second spaced apart means for receiving the edges of the circuit boards and carrying them through the tunnel from end to end;
- first and second means for guiding the first and second receiving means to maintain the spacing therebetween; and
- means for controlling the temperature of the receiving means to match the temperature of the circuit boards in the tunnel.

34. The furnace assembly of claim 33, additionally comprising first and second hollow rails for guiding the first and second receiving means to maintain the spacing therebetween, the temperature controlling means comprising means for circulating a coolant fluid through the hollow rails and means for adjusting the temperature of the coolant fluid.

35. The furnace assembly of claim 34, in which the circulating means comprises a pump connected to one end of the first rail, a heat exchanger connected to the one end of the second rail, a conduit connecting the pump to the heat exchanger, and a conduit connecting the other end of the first and second rails.

36. The furnace assembly of claim 35, in which the adjusting means comprises means for sensing the temperature of the fluid and means responsive to the temperature sensing means for controlling the flow rate of the coolant fluid through the rails.

37. The furnace assembly of claim 36, in which the coolant fluid is water.

38. The furnace assembly of claim 37, additionally comprising first and second supplemental heaters in proximity to the first and second rails, respectively, the temperature of the coolant fluid being less than that of the circuit boards and the supplemental heaters raising the temperature of the first and second receiving means to that of the circuit boards.

39. The furnace assembly of claim 38, additionally comprising means for separately adjusting the temperature of the first and second supplemental heaters.

* * * * *